United States Patent [19]

Holt et al.

[11] 4,097,101

[45] Jun. 27, 1978

[54] ELECTRICAL INTERCONNECTION BOARDS WITH LEAD SOCKETS MOUNTED THEREIN AND METHOD FOR MAKING SAME

[75] Inventors: Richard C. Holt, Fairhaven, Mass.; Neil F. Damon, Manville, R.I.; Richard J. Hanlon, Attleboro, Mass.

[73] Assignee: Augat Inc., Attleboro, Mass.

[21] Appl. No.: 744,134

[22] Filed: Nov. 22, 1976

[51] Int. Cl.² .......... H05K 1/12

[52] U.S. Cl. .......... 339/17 C; 29/626; 339/221 R; 339/258 R

[58] Field of Search .......... 29/626, 630 D; 339/17 B, 17 C, 17 CF, 17 LC, 220 R, 221 R, 221 M, 258 R

[56] References Cited

U.S. PATENT DOCUMENTS

| | | | |
|---|---|---|---|
| 2,456,118 | 12/1948 | Foster | 29/630 D |
| 2,967,285 | 1/1961 | Freitas | 339/221 M |
| 2,973,499 | 2/1961 | Hammell | 339/17 C |
| 3,187,298 | 6/1965 | Shannon | 339/258 R |
| 3,252,204 | 5/1966 | McFaddan | 29/626 |
| 3,504,328 | 3/1970 | Olsson | 339/17 C |
| 3,784,965 | 1/1974 | Murphy | 339/258 R |
| 3,792,412 | 2/1974 | Madden | 339/17 C |

FOREIGN PATENT DOCUMENTS

| | | | |
|---|---|---|---|
| 1,540,251 | 1/1965 | Germany | 339/221 M |

*Primary Examiner*—Neil Abrams

*Attorney, Agent, or Firm*—Weingarten, Maxham & Schurgin

[57] ABSTRACT

An electrical interconnection board with lead sockets mounted in holes therein. The lead sockets are hollow cylindrical elements having a tapered opening at one end and a plurality of normally converging flexible fingers at the other end. The lead sockets are force fitted into the holes in the board with the receptacle end of the socket opening into the component side of the board. The invention is also concerned with the method for mounting lead sockets to electrical interconnection boards.

8 Claims, 8 Drawing Figures

ELECTRICAL INTERCONNECTION BOARDS WITH LEAD SOCKETS MOUNTED THEREIN AND METHOD FOR MAKING SAME

FIELD OF THE INVENTION

This invention relates generally to electrical interconnection means and more particularly concerns electrical interconnection boards such as printed circuit boards having lead sockets mounted in holes in the board.

DISCUSSION OF THE PRIOR ART

Electrical interconnection boards, normally referred to as printed circuit, printed wiring or panel boards, normally have mounted thereto a plurality of electronic components such as dual-in-line electronic packages which may be integrated circuit packages, or other types of electronic components formed with any number of leads. The boards are provided with holes and with either printed circuit paths or conductive voltage planes. In some prior art devices, leads of electronic components are inserted into plated-through holes which are electrically connected to various printed circuit paths on one or both sides of the board. An electronic device lead would be inserted through one of the plated-through holes and would be individually soldered or collectively wave soldered so that the hole is filled with solder to permanently mount and electrically connect the component to the board.

It is often desired to employ the concept of pluggability, that is, to be able to plug the leads of a component into a board for whatever purposes are desired and then to remove it and plug another component into the board. This, of course, is not possible with the previously discussed method of mounting components to the board because the component leads are soldered thereto. However, it is well known to provide two-part socket sleeve assemblies which are mounted in holes in panel boards wherein one end of the sleeve has a lead receiving socket and the other end normally provides a solder tail or a wire wrapping pin. The solder tail and wire wrapping pins project for some appreciable distance beyond the non-component side of the board and the lead receiving socket end of the sleeve normally projects a short distance beyond the other side of the board. The sleeve socket end is necessarily somewhat larger than might otherwise be desired because of the requirement that there be a tapered opening to facilitate inserting component leads and that there be a contact insert within the socket assembly device itself to frictionally engage the lead. Thus it is necessary that the socket end of the sleeve project beyond the board surface in order to provide the desired opening which is larger than the hole through the board. When such a socket assembly with a contact insert is used, pluggability is available but at a relatively high cost because of the necessity for using the two-element socket assembly described above which not only is expensive to manufacture but the two elements must be combined before inserting into holes in the board.

SUMMARY OF THE INVENTION

It is an object of the present invention to provide pluggability of electronic components into interconnection boards at a substantially reduced cost while at the same time reducing the overall assembly thickness of the board and components. The result of thickness reduction is improved stacking density because each board may thereby be placed closer to the adjacent facing board.

Lead sockets which are similar to those used in sleeves previously built into the socket assemblies described above, are force fitted into plated-through holes in an electrical interconnection board in such a manner that they are retained therein and are adapted to receive and removably retain the leads of electronic components, including dual-in-line electronic packages. While these lead sockets retain the leads of the electronic components, it also permits them to be readily removed when desired, and replaced by other components whose leads are then inserted into the same lead sockets mounted in the board.

Several alternative constructions of the lead sockets are provided, showing somewhat different means by which the lead socket is permanently retained in the hole in the board. These embodiments include knurled surfaces, inwardly projecting grooves and outwardly projecting ridges. One method for mounting the lead socket to the board includes a tool having a male pin adapted to hold the lead socket. The tool is formed with a tapered surface above the pin which, when forced into the board, mounts the lead socket thereto and forms a countersunk hole in the top portion of the hole in the board. This countersunk hole thereby provides a sufficiently tapered lead-in to facilitate insertion of the component leads into the holes and thereupon into the lead sockets.

BRIEF DESCRIPTION OF THE DRAWING

The advantages, features and objects of this invention will be more clearly understood from the following detailed description when taken in conjunction with the accompanying drawing in which.

DETAILED DESCRIPTION OF THE PREFERRED EMBODIMENTS

Figure 1:
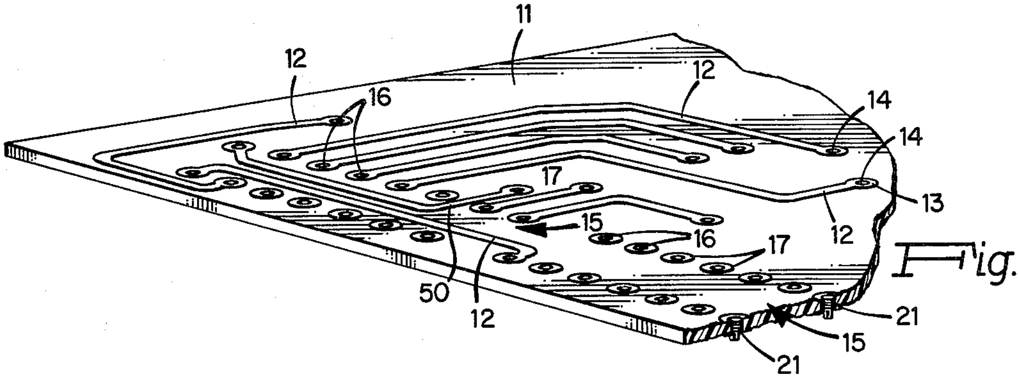
FIG. 1 is a perspective view of a portion of a printed circuit board having lead sockets inserted in holes therein in accordance with this invention.

With reference now to the drawing and more particularly to FIG. 1 thereof, there is shown a portion of a printed circuit board 11 having paths 12 of electrically conductive material on one side thereof, each of paths 12 terminating in a contact pad 13 of electrically conductive material surrounding a hole 14. Holes 14 are plated-through having a conductive copper base and conductive solder coating thereover in conventional manner. FIG. 1 shows several individual plated-through holes 14 at the ends of conductive paths 12 and two dual-in-line arrays 15 of holes 16 having contact pads 17 electrically connected to the plating in holes 16. In each hole 16 is a lead socket 21 representing any of the various embodiments of the lead sockets shown and described herein.

Figure 2:
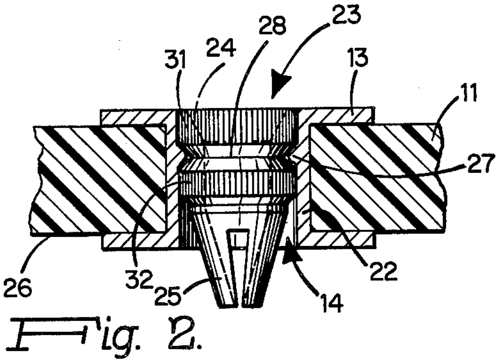
FIG. 2 is a fragmentary enlarged sectional view through a plated-through hole in the board of FIG. 1 showing a preferred embodiment of a lead socket of this invention mounted in the hole.

With reference now to FIG. 2 there is shown in enlarged cross-section a single plated-through hole 14 having a contact pad 13 and plating 22 on the inside surfaces of the hole. Mounted in the hole is a lead socket 23 shown with a tapered opening 24 at the top and normally converging flexible fingers 25 at the other end projecting somewhat beyond the bottom side 26 of board 11. Lead socket 23 is force fitted into the plating 22 in hole 14. Annular groove 28 receives some of the metal 27 which is displaced due to the force fit, thereby assisting in firmly longitudinally anchoring the lead socket in the hole. Cylindrical surfaces 31 and 32 of the lead socket are knurled or slotted to facilitate firm rotational engagement with the metal 22 of the plated-through hole.

It should be noted that in the drawing the thicknesses of the plating in the holes and the contact pads surrounding holes are exaggerated for purposes of clarity. Dimensions are given as examples only. A conventional printed circuit board as shown in the drawing may be 0.062 inch (1.575 mm) thick while the metal portion 13 is approximately 0.0035 inch (0.0889 mm) thick, and metal portion 22 is approximately 0.0015 inch (0.038 mm) thick, both being a combination of copper and solder. Although only one metal is indicated, normally the base metal is copper and it is coated with tin lead (solder).

Figure 3:
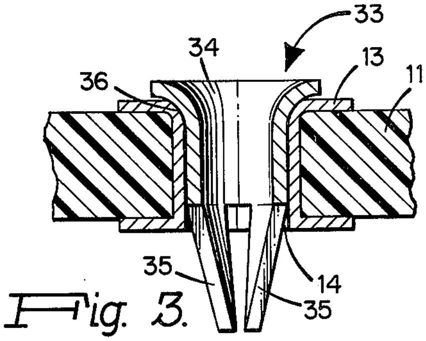
FIG. 3 is a view similar to FIG. 2 of another embodiment of a lead socket mounted to the board of FIG. 1.
Figure 4:
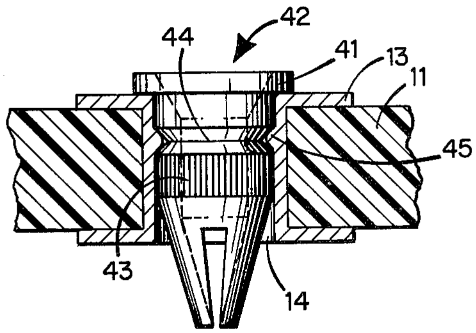
FIG. 4 is a view similar to FIG. 2 of still another embodiment of a lead socket mounted to the board of FIG. 1.

FIG. 3 shows a modified embodiment of the invention wherein lead socket 33 is flared at its socket opening to form a flange 34 which facilitates entry of a component lead into the opening. As with each of the lead sockets described herein, the lead is firmly held in place between normally converging fingers 35 at the other end of the lead socket. Lead socket 33 may be retained in hole 14 by means of any of the configurations shown herein. When lead socket 33 is forced into hole 14, some of the plating 36 contacted by the outside of the rounded top of the lead socket is displaced as shown in the drawing. The embodiment of FIG. 4 is somewhat similar to that of FIG. 2 except that a flange or shoulder 41 is provided in top of lead socket 42 to provide a positive stop for the insertion machinery when the lead socket is forced into hole 14. Knurling or grooves 43 are shown on the cylindrical mid-portion of the lead socket and annular V-shaped groove 44 is provided to receive displaced plating material 45 for better axial and rotational anchoring, in the manner shown in FIG. 2.

Figure 5:
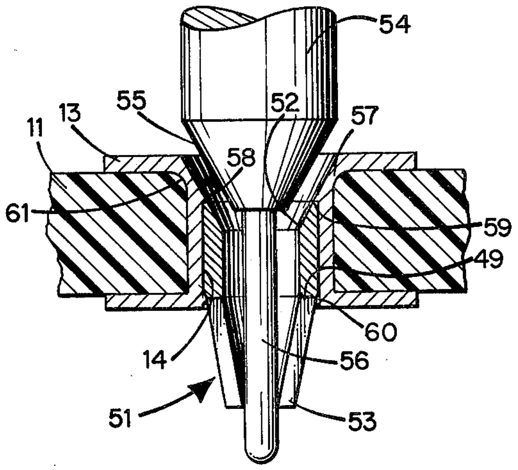
FIG. 5 is a view similar to FIG. 2 of yet another embodiment of a lead socket mounted to the board of FIG. 1 and showing the tool for mounting the lead socket.

FIG. 5 shows a lead socket 51 having a tapered opening 52 and normally converging fingers 53 which has been inserted into hole 14 by means of a tool 54 having a tapered surface 55 and a projecting pin 56. Pin 56 is substantially similar in size to a lead of an electronic component and may be used to pick up and hold lead socket 51 by being inserted through tapered opening 52 and between fingers 53 which frictionally engage pin 56. Tool 54 then proceeds downwardly to insert lead socket 51 into hole 14 and continues downward to, in effect, countersink hole 14 and push the top of lead socket 51 below the top surface of board 11 by approximately 0.012 inch (0.305 mm), or about 20% of the depth of the hole. Tapered surface 55 on tool 54 is chosen in match the slope of tapered opening 52 so that the displaced plating material 57 forms a continuation of lead socket opening 52 and effectively provides a tapered lead-in for the lead of an electrical component. Some of the plating material 58 tends to flow over the annular top surface 59 of the lead socket, thereby providing a smooth tapered opening into the socket. In this manner, the top of the opening is somewhat larger than either hole 14 or the opening in lead socket 51 but by displacing electrically conductive plating material 57 and, to some extent, displacing some of the electrically insulating material 61 of board 11, the hole is formed as desired while the electrical integrity of the plating is maintained. Note that there is a build-up of plating material 60 at bend 49 of the socket due to the interference fit when the socket is inserted, wherein plating material is caused to flow. In this particular embodiment, plating material 60 builds up in such a position that it tends to urge fingers 53 together. In order to prevent them from being too tight for insertion of an IC lead, pin 56 extends between the distal ends of the fingers during insertion into hole 14, thereby prestressing them to the desired amount of bias to frictionally receive an IC lead. However, material 60 continues to act as a reinforcement at bent 49 thereby making the spring action of the fingers somewhat stronger. Any desired means may be used to inhibit longitudinal and rotational movement of socket 51 in hole 14 as described in connection with other embodiments shown and described herein.

Alternatively to placing lead socket 51 in hole 14 by means of tool 54, the sockets could be initially placed in the holes by hand or a large number could be placed simultaneously by vibrating the pre-drilled board with a large number of lead sockets dispersed over the surface thereof. Since the top of each lead socket is too large to enter a hole in the board, they will ultimately enter the holes with the proper orientation, that is, with the converging fingers in the hole. Tool 54 is then used, individually or in a ganged arrangement, to set the sockets and provide the tapered entry as shown in FIG. 5. This method is a particularly preferred embodiment of this invention because it permits the hole itself to provide the desired lead-in taper. Circuit density may thereby be increased since circuit paths 50 (FIG. 1) may be placed between contact pads in a dual-in-line array. Also the diameter of conductive material used for making the pads 13 may be reduced since the smallest possible diameter lead socket is used.

Figure 6:
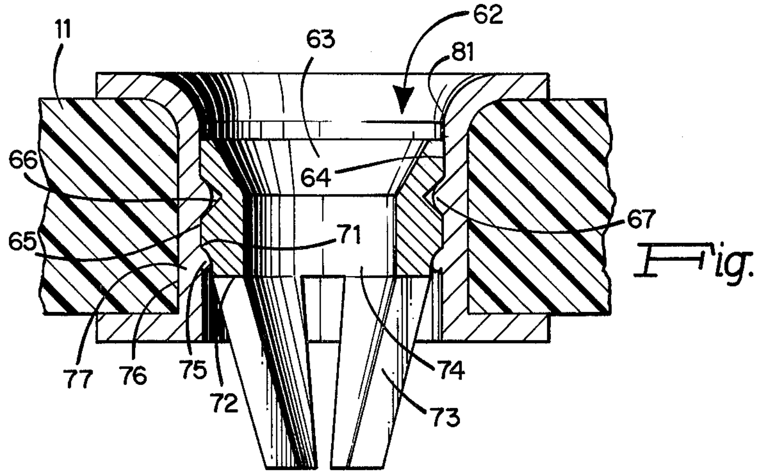
FIG. 6 is a view on an enlarged scale similar to FIG. 2 of another alternative embodiment of the lead socket mounted to the board of FIG. 1.

FIG. 6 discloses an additional embodiment of the invention wherein lead socket 62 with tapered opening 63 is formed with annular collars 64 and 65 longitudinally separated by a V-groove 66 with plating material 67 partially filling the groove. The cylindrical outer surfaces of either or both collars 64 and 65 may be knurled or otherwise roughened if desired, in the manner of the lead sockets of FIGS. 2 and 4. The lower termination 71 of collar 65 is longitudinally spaced a short distance from the bend 72 where fingers 73 angle inwardly from the body 74 of the socket toward the longitudinal axis thereof. This permits a build-up of plating material 75, which occurs when socket 62 is forced into hole 76 in board 11 with plating 77 lining the hole, without affecting the spring characteristics of fingers 73 at bend 72.

Figure 7:
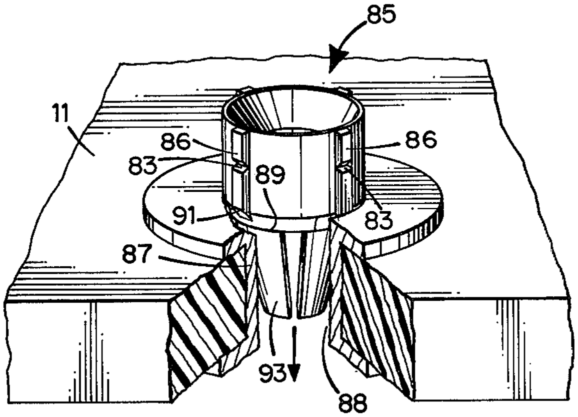
FIG. 7 is a perspective view of still another alternative embodiment of the lead socket of this invention showing the lead socket before being seated in the board.

In FIG. 7 there is shown a modified lead socket 85 having a plurality of radially projecting splines 86 which provide the interference fit with plating 87 in hole 88 in board 11. These splines 86 may be formed with a circumferential groove 83 similar to groove 66 in FIG. 6 or not as desired. Splines 86 extend down the side of socket 85 for a distance similar to the longitudinal length of collars 64 and 65 of socket 62 in FIG. 6. That is, bend 89 where fingers 93 commence converging is below the bottom termination 91 of splines 86. These radially projecting splines are partially to prevent angular motion of the lead socket in the hole and partially to account for tolerances in hole sizes which vary relatively widely in plated-through holes.

While lead socket 85 functions in a manner similar to socket 62 in FIG. 6 as to plating displacement, less plating is displaced because there in an interference fit only where splines 86 contact the plating in the hole. A particular advantage of the FIG. 7 embodiment is that less insertion force is necessary to mount the lead socket to the plated-through hole in the board. An additional advantage is that tolerance of plated-through holes need not be held tighter than industry standard in order to positively engage lead socket 85.

Figure 8:
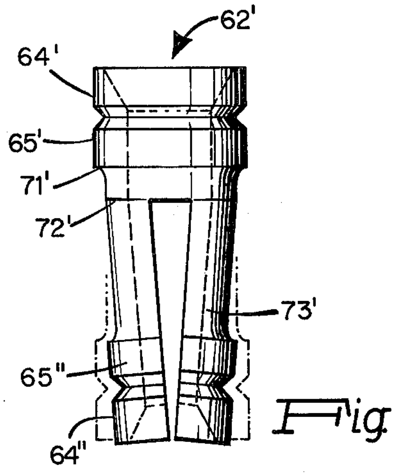
FIG. 8 shows the lead socket of FIG. 6 in an alternative form designed to facilitate manufacturing thereof.

The lead socket 62 of FIG. 6 is shown in somewhat modified form in FIG. 8 as lead socket 62' with similar projections 64'' and 65'' on the distal ends of fingers 73'. This is for purposes of manufacturing convenience and collars 64'' and 65'' have no other function when lead socket 62' is mounted in a hole in a board. The blank is formed from tubing, inwardly beveled at both ends and a portion of the thickness of the wall is removed between projections 65' and 65'' before material is radially milled out forming fingers 73'. It has been found to be more efficient to form the lead socket blank with the same internal taper on each end so that orientation of the socket, which is only about 0.1 inch (2.54 mm) long, is not necessary until all machining and other forming has been completed. While the other embodiments are shown with the outer surfaces of the resilient fingers smooth, it is likely that they would all be made the same way and whatever annular projections are at the top would also appear at the distal ends of the fingers as in FIG. 8.

The lead sockets used in this invention may be made by any practical process, such as machining, stamping and rolling, among others. They may be relatively conventional elements or may be formed especially for use in this invention. The primary requirement is that the lead sockets are seated firmly in the holes in the board and that they frictionally engage the dual-in-line package (DIP) leads. However, the individual lead sockets can be removed or replaced as required.

The advantages of the present invention over the prior art may now be readily appreciated. The leads of electronic components, including DIP's, remain pluggable so that they can be removed or replaced at any time, while the profile of the board with DIP's is the same as a board with the DIP's soldered directly into plated-through holes, that is, in a permanent, unpluggable condition. The distance by which the fingers of the lead sockets described herein project beyond the bottom side of board 11 is substantially similar to or less than the distance by which the leads of electronic components normally project beyond the bottom side of the board when they are soldered in plated-through holes in accordance with prior art techniques.

In order to fully appreciate the value of the present invention, it should be noted that wave soldering operations, which are not necessary when employing the present invention, involve some or all of the following: (a) lead clinching; (b) board pre-bake; (c) post cleaning; (d) gold contact masking before wave soldering; (e) blow holes and various solder joint defects requiring expensive touch-up operations; (f) cracked solder joints during board service life; (g) inspection necessary after soldering; (h) damage to heat sensitive components; (i) board warpage; (j) special soldering fixtures; (k) solder masks; (l) flux residues and entrapments; and (m) costly soldering equipment and maintenance. Additionally, this invention provides field replacement with total pluggability of all components including discrete components. It maintains the lowest possible board profile and permits open access on the noncomponent or bottom side of the board for maximum inspectability. Furthermore, the density of a printed circuit board can be increased through the use of this invention by reducing pad diameters such as pads 13 needed for solder joint construction.

For high vibration uses soldering or lead clinching may be applied to the bottom side of the board to permanently connect certain selected leads of a component, such as the corners of a DIP. Such soldering or clinching can be done individually and the need therefor would be relatively seldom. Removal of such soldered DIP's is also easily accomplished by simply desoldering only a few points.

In view of the above description, it is likely that modifications and improvements will occur to those skilled in the art which are within the scope of this invention.

What is claimed is:

1. An electrical interconnection device comprising:

a flat generally rectangular sheet of electrically insulative material;

electrically conductive material secured in discrete areas on at least one side of said sheet, said sheet having a multiplicity of holes therethrough, at least some of said holes normally intercepting one of said areas of electrically conductive material;

electrically conductive plating material on the inside surfaces of at least some of said holes thereby forming plated-through holes, said plating material being electrically interconnected with said respective intercepted discrete areas of electrically conductive material; and a substantially rigid lead socket force fitted into at least some of said plated-through holes, said socket having a generally cylindrical body portion, said body portion having a roughened surface, whereby upon force-fitting insertion of said socket, some of said plating material in said plated-through hole is displaced by said body portion, each said lead socket being formed with an axial opening therethrough and a plurality of flexible fingers normally converging toward one another at one end and a tapered opening at the other end, the top of said lead socket surrounding said tapered opening being below the surface of said electrically conductive material on said sheet, said tapered opening being adapted to receive an electronic component lead and said fingers being adapted to frictionally engage said lead as it projects through said lead socket.

2. The device recited in claim 1 wherein said plating material is displaced to form a tapered opening at the same angle and forming a continuation of said tapered opening in said lead socket.

3. An electrical interconnection device comprising:

a flat generally rectangular sheet of electrically insulative material;

electrically conductive material secured in discrete areas on at least one side of said sheet, said sheet having a multiplicity of holes therethrough, at least some of said holes normally intercepting one of said areas of electrically conductive material;

electrically conductive plating material on the inside surfaces of at least some of said holes thereby forming plated-through holes, said plating material being electrically interconnected with said respective intercepted discrete areas of electrically conductive material;

a substantially rigid lead socket force fitted into at least some of said plated-through holes, said socket having a generally cylindrical body portion, said body portion having a roughened surface, whereby upon force-fitting insertion of said socket, some of said plating material in said plated-through hole is displaced by said body portion, each said lead socket being formed with an axial opening therethrough and a plurality of flexible fingers normally converging toward one another at one end and a tapered opening at the other end, said fingers converging from a bend point at the lower end of said body portion of said lead socket, said bend being normally within said plated-through hole, some of said plating material being gathered around said bend thereby reinforcing the inward biasing action of said fingers, said tapered opening being adapted to receive an electronic component lead and said fingers being adapted to frictionally engage said lead as it projects through said lead socket.

4. An electrical interconnection device comprising:

a flat generally rectangular sheet of electrically insulative material;

electrically conductive material secured in discrete areas on at least one side of said sheet, said sheet having a multiplicity of holes therethrough, at least some of said holes normally intercepting one of said areas of electrically conductive material;

electrically conductive plating material on the inside surfaces of at least some of said holes thereby forming plated-through holes, said plating material being electrically interconnected with said respective intercepted discrete areas of electrically conductive material;

a substantially rigid lead socket force fitted into at least some of said plated-through holes, said socket having a generally cylindrical body portion, said body portion having a roughened surface, whereby upon force-fitting insertion of said socket, some of said plating material in said plated-through hole is displaced by said body portion, each said lead socket being formed with an axial opening therethrough and a plurality of flexible fingers normally converging toward one another at one end and a tapered opening at the other end, said fingers converging from a bend point at the lower end of said body portion of said lead socket, said bend being normally within said plated-through hole and being longitudinally spaced from that portion of said body portion in interference fit with said plating material by a relief area, whereby some of said plating material gathers around said relief area free from said bend, said tapered opening being adapted to receive an electronic component lead and said fingers being adapted to frictionally engage said lead as it projects through said lead socket.

5. A method for making an electrical interconnection device comprising a flat generally rectangular sheet of electrically insulative material having electrically conductive material secured in discrete areas on at least one side thereof, said method comprising the steps of:

boring a multiplicity of holes through said sheet, at least some of said holes intercepting one of said areas of electrically conductive material;

plating at least some of said holes with electrically conductive material to form plated-through holes, said plating material being electrically connected to said intercepted conductive areas;

inserting substantially rigid lead sockets into at least some of said plated-through holes, the body of each said lead socket being force fitted into one of said plated-through holes, each said lead socket having a generally cylindrical body portion, said body portion having a roughened surface, whereby upon force-fitting insertion of said socket, some of said plating material in said plated-through hole is displaced by said body portion, said socket also having an axial opening therethrough and being formed with a plurality of normally converging flexible fingers on one end and a tapered opening at the other end, said inserting continuing until the top of said lead socket surrounding said tapered opening is below the surface of said sheet; and countersinking said hole formed by said boring and plating steps whereby said countersunk hole forms a tapered opening as a continuation of the tapered opening in said lead socket;

whereby said tapered opening is adapted to receive an electronic component lead and said fingers are adapted to frictionally engage said lead as it projects through said lead socket.

6. The method recited in claim 5 wherein said inserting and countersinking steps are accomplished by means of a tool having a body portion with a taper corresponding to the taper of said tapered opening in said lead socket.

7. A method for making an electrical interconnection device comprising a flat generally rectangular sheet of electrically insulative material having electrically conductive material secured in discrete areas on at least one side thereof, said method comprising the steps of:

boring a multiplicity of holes through said sheet, at least some of said holes intercepting one of said areas of electrically conductive material;

plating at least some of said holes with electrically conductive material to form plated-through holes, said plating material being electrically connected to said intercepted conductive areas; and inserting substantially rigid lead sockets into at least some of said plated-through holes, the body of each said lead socket being force fitted into one of said plated-through holes, each said lead socket having a generally cylindrical body portion, said body portion having a roughened surface, whereby upon force-fitting insertion of said socket, some of said plating material in said plated-through hole is displaced by said body portion, said socket also having an axial opening therethrough and being formed with a plurality of normally converging flexible fingers on one end and a tapered opening at the other end, the bend point on said body from which said fingers converge is normally located within said plated-through hole, some of said plating material flowing inwardly and bearing against said fingers at said bend thereby reinforcing the inward biasing of said fingers;

whereby said tapered opening is adapted to receive an electronic component lead and said fingers are adapted to frictionally engage said lead as it projects through said lead socket.

8. The method recited in claim 7 wherein said inserting step is accomplished by means of a tool having a body portion with a taper corresponding to the taper of said tapered opening in said lead socket, and an axially projecting pin engaging said fingers of said lead socket, the combination of said reinforcing plating material at said bend and said projecting pin upon insertion prestressing said fingers to permit them to positively and removably engage the electronic component leads.

* * * * *